United States Patent
Su et al.

(10) Patent No.: US 7,843,365 B2
(45) Date of Patent: Nov. 30, 2010

(54) DATA ENCODING AND DECODING METHODS AND COMPUTER READABLE MEDIUM THEREOF

(75) Inventors: Yun-Ter Su, Taipei (TW); Yen-Chen Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 58 days.

(21) Appl. No.: 12/464,268

(22) Filed: May 12, 2009

(65) Prior Publication Data

US 2010/0141486 A1  Jun. 10, 2010

(30) Foreign Application Priority Data

Dec. 4, 2008  (TW) .............................. 97147171 A

(51) Int. Cl.
 *H03M 5/00* (2006.01)
(52) U.S. Cl. ......................................... 341/55; 341/95
(58) Field of Classification Search ................... 341/55, 341/95
 See application file for complete search history.

(56) References Cited

U.S. PATENT DOCUMENTS 6,369,723 B1 * 4/2002 Pieterse et al. ................ 341/55
7,280,055 B2 10/2007 Drasny

FOREIGN PATENT DOCUMENTS

| TW | 310400 | 7/1997 |
|---|---|---|
| TW | 472464 | 1/2002 |
| TW | 525354 | 3/2003 |
| TW | 566008 | 12/2003 |
| TW | 569553 | 1/2004 |
| TW | I226758 | 1/2005 |
| TW | I240495 | 9/2005 |
| TW | I251983 | 3/2006 |
| TW | I254513 | 5/2006 |
| TW | I273776 | 2/2007 |
| TW | I298449 | 7/2008 |
| TW | I226607 | 5/2009 |

OTHER PUBLICATIONS

English abstract of TW I226607.

(Continued)

*Primary Examiner*—Khai M Nguyen
(74) *Attorney, Agent, or Firm*—Thomas, Kayden, Horstemeyer & Risley

(57) ABSTRACT

A data encoding method is provided. The data has several bytes, and each byte has n bits. The data encoding method includes the following steps. First, a specific value is defined. Next, the data is divided into one or several data blocks each having m bytes, wherein $m \leq 2^n - 2$. Following that, a replacing value, not appearing in the m bytes of the data block, is obtained from each data block respectively, wherein the replacing value is not equal to the specific value. Then, the values of the bytes being the specific value are replaced to the replacing value in the m bytes of each data bock respectively. Afterwards, a starting byte is allocated at the start of each data block, and the replacing value is stored to the starting byte so as to obtain the data block being encoded respectively. Each data block being encoded has m+1 bytes.

18 Claims, 3 Drawing Sheets

OTHER PUBLICATIONS

"String Data Types" p. 281-314, Chapter 10.
English abstract of TW 472464.
English abstract of TW I254513.
English abstract of TW 310400.
English abstract of TW I251983.
English abstract of TW I273776.
English abstract of TW I298449.
English abstract of TW I226758.
English abstract of TW I240495.
English abstract of TW 569553.
English abstract of TW 566008.
English abstract of TW 525354.

* cited by examiner

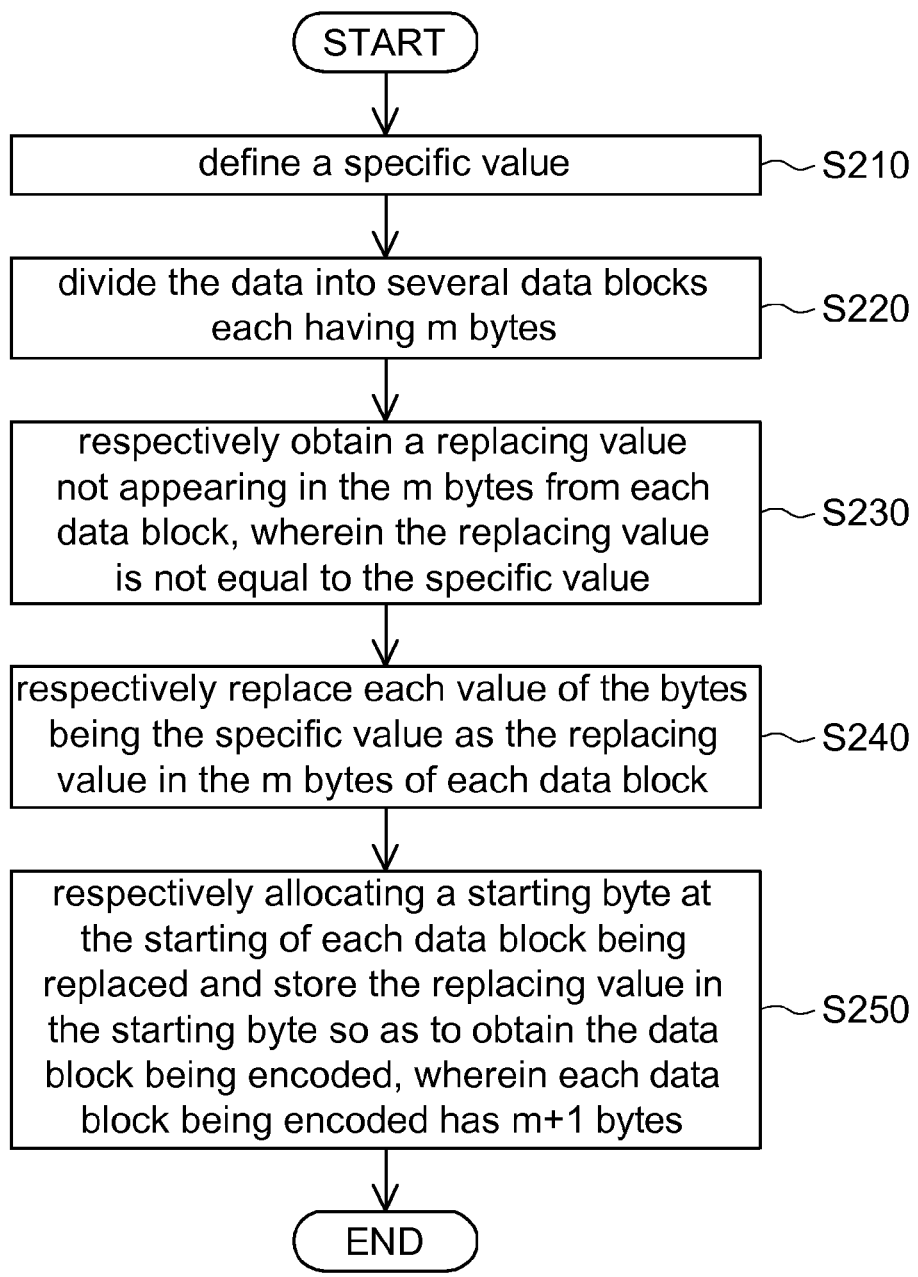

DATA ENCODING AND DECODING METHODS AND COMPUTER READABLE MEDIUM THEREOF

This application claims the benefit of Taiwan application Serial No. 97147171, filed Dec. 4, 2008, the subject matter of which is incorporated herein by reference.

BACKGROUND OF THE INVENTION

1. Field of the Invention

The invention relates in general to data encoding and decoding methods and computer readable medium thereof, and more particularly to a data encoding method and a decoding method which utilize specific character replacement and computer readable medium thereof.

2. Description of the Related Art

In the course of data processing, some values are defined to have specific mechanism. For example, in C Language, a string is a zero-terminated string, that is, the string is ended with such a character NULL ("\0"), wherein the binary value of the character NULL is "0". Thus, during the process of converting a binary data into a string, the string is split and is determined to terminate when the bit whose binary value is "0" is encountered. However, as "0" usually occurs in the binary data stream, during the process of converting a binary data into a string, the string will be inappropriately split and the data following the character being split will be missed.

To avoid the string being split, many data encoding methods have been provided. Referring to FIG. 1, an example of simulated diagram of a data executed by a conventional data encoding method is shown. The values of the 9 bytes in the data A before encoding are "0", "0", "1", "2", "0", "3", "5", "0", "4", respectively. The values of the 10 bytes in the encoded data e(A) are "5", "1", "2", "5", "1", "2", "3", "5", "4", respectively. The 1-st byte in the data e(A) denotes the number of "0" in the data A before encoding plus 1, that is, "5" in this example. The 2-nd to the 5-th bytes in the data e(A) record the position of the bytes whose values are "0". The 6-th to the 10-th bytes of the data e(A) sequentially record the non-"0" values of the bytes in the data A.

However, in the above method which records the position of the bytes whose values are "0", an array is generated during the process of decoding the data e(A) into the data A, and the 1-st byte in data e(A) is read so as to obtain the number of the bytes whose value are "0" in the data A. Following that, the 2-nd to the 5-th byte in the data e(A) are read so as to obtain the position of the bytes whose values are "0" in the data A. Next, the values of the 6-th to the 10-th bytes in the data e(A) are sequentially written to the position of the bytes whose values are non-"0" in the data A. Thus, the complexity of decoding is increased and the efficiency of decoding is decreased.

SUMMARY OF THE INVENTION

The invention is directed to a data encoding method and a decoding method and computer readable medium thereof. Undesired specific value of the data block is replaced as a replacing value which does not appear in the data block, so that data will not be missed during the process of data processing.

According to a first aspect of the present invention, a data encoding method is provided. The data has several bytes, and each byte has n bits. The data encoding method includes the following steps. First, a specific value is defined. Next, the data is divided into one or several data blocks each having m bytes, wherein $m \leq 2^n - 2$. Following that, a replacing value, not appearing in the m bytes of the data block, is obtained from each data block respectively, wherein the replacing value is not equal to the specific value. Then, the values of the bytes being the specific value is replaced as the replacing value in the m bytes of each data block respectively. Afterwards, a starting byte is allocated at the start of each data block, and the replacing value is stored in the starting byte so as to obtain the data block being encoded respectively. Each data block being encoded has m+1 bytes.

According to a second aspect of the present invention, a data decoding method is provided. The data has several data blocks each having m+1 bytes, and each byte has n bits, wherein $m \leq 2^n - 2$. The data decoding method includes the following steps. First, a specific value is defined. Next, a starting byte of each data block is respectively read so as to obtain a replacing value. Afterwards, the values of the bytes being the replacing value are replaced as the specific value in the m bytes following the starting byte of each data block. Then, the starting byte of each data block is respectively released so as to obtain the data block being decoded, wherein each data block being decoded has m bytes.

According to a third aspect of the present invention, a computer readable medium is provided. The computer readable medium has computer executable data, which comprises executing codes and when executed by an electronic device, cause the device to execute the above-mentioned data encoding method.

According to a fourth aspect of the present invention, a computer readable medium is provided. The computer readable medium has computer executable data, which comprises executing codes and when executed by an electronic device, cause the device to execute the above-mentioned data decoding method.

The invention will become apparent from the following detailed description of the preferred but non-limiting embodiments. The following description is made with reference to the accompanying drawings.

BRIEF DESCRIPTION OF THE DRAWINGS

FIG. 1 shows an example of simulated diagram of a data executed by a conventional data encoding method;

FIG. 2 shows an example of a flowchart of a data encoding method according to a preferred embodiment of the invention;

DETAILED DESCRIPTION OF THE INVENTION

The invention relates to a data encoding method and a data decoding method. The data encoding method is for encoding a data having several bytes. Each byte has n bits. The data encoding method includes the following steps. First, a specific value is defined. Following that, the data is divided into one or several data blocks. Each data block has m bytes, wherein $m \leq 2^n - 2$. Next, a replacing value, not appearing in the m bytes of the data block, is obtained from each data block respectively. The replacing value is not equal to the specific value. Then, the values of the bytes being the specific value are replaced as the replacing value in the m bytes of each data block respectively. Afterwards, a starting byte is allocated at the start of each data block, and the replacing value is stored in the starting byte so as to obtain the data block being encoded respectively. Each data block being encoded has m+1 bytes.

The data decoding method is for decoding a data having several data blocks. Each data block has m+1 bytes, and each byte has n bits, wherein $m \leq 2^n-2$. The data decoding method includes the following steps. First, a specific value is defined. Next, a starting byte of each data block is read so as to obtain a replacing value respectively. Afterwards, the values of the bytes being the specific value are replaced as the replacing value in the m bytes following the starting byte of each data block. Then, the starting byte of each data block is released so as to obtain the data block being decoded respectively. Each data block being decoded has m bytes. The data encoding and decoding methods of the invention will be further described in an exemplary embodiment disclosed below.

Data Encoding Method

Figure 3:
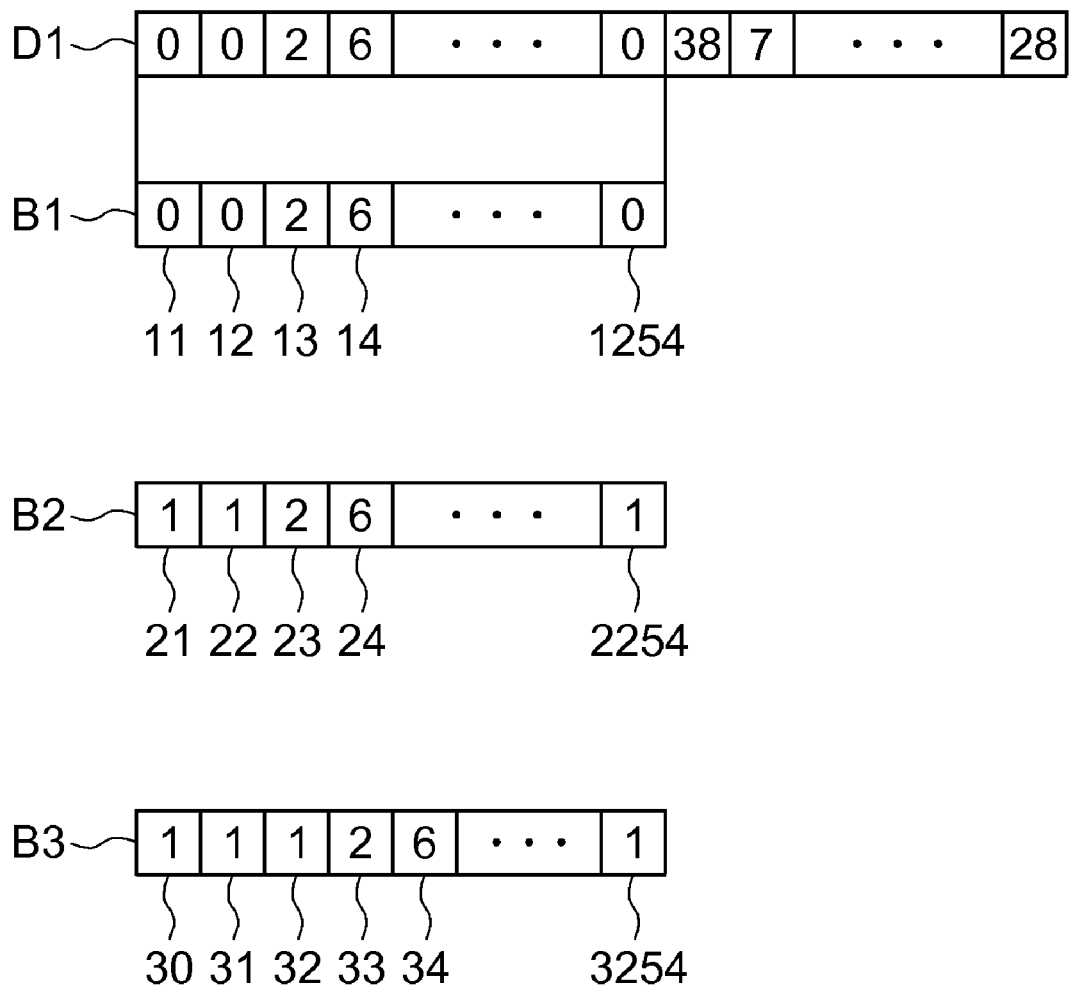
FIG. 3 shows an example of simulated diagram of a data executed by the data encoding method of FIG. 2.

Referring to both FIG. 2 and FIG. 3. FIG. 2 shows an example of a flowchart of a data encoding method according to a preferred embodiment of the invention. FIG. 3 shows an example of simulated diagram of a data executed by the data encoding method of FIG. 2. The data encoding method is for encoding a data D1 as shown in FIG. 3. The data D1 has several bytes, and each byte has n bits. Thus, the value of each byte can be any one of "0"~"$(2^n-1)$". Let n=8 be taken for example. In other words, the value of each byte can be any one of "0"~"255".

The data encoding method includes the following steps. First, the method begins at step S210, a specific value is defined as "0". Following that, the method proceeds to step S220, the data D1 is divided into one or several data blocks each having 254 ($2^8-2$) bytes. For the convenience of elaboration, in FIG. 3, a data block B1 is divided from the data D1, wherein the 254 bytes 11~1254 of the data block B1 are "0", "0", "2", "6", ..., "0", respectively.

Next, the method proceeds to step S230, the replacing value not appearing in the bytes 11~1254 is respectively obtained from the data block B1, wherein the replacing value is not equal to the specific value "0". Preferably, in the example of FIG. 3, the replacing value is the minimum value not appearing in bytes 11~1254. In the present embodiment, the minimum value not appearing in bytes 11~1254 is "1", and the replacing value is exemplified by "1".

Then, the method proceeds to step S240, in the bytes 11~1254 of each data block B1, the values of the bytes 11, 12 and 1254 being the specific value "0" are replaced as the replacing value "1" so as to obtain a replaced data block B2. The values of the 254 bytes 21~2254 of the data block B2 are "1", "1", "2", "6", ..., "1", respectively.

Afterwards, the method proceeds to step S250, a starting byte 30 is allocated at the starting of the replaced data block B2, and a replacing value "1" is stored in the starting byte 30 so as to obtain the encoded data block B3, wherein the data block B3 being encoded has 255 bytes 30~3254 as shown in FIG. 3. Thus, the encoded data block B3 will not have a specific value "0". Therefore, this embodiment is able to avoid the situation that the string might be inappropriately split during the process of converting the binary data D1 into a string, and to avoid the situation that the data might be missed.

In the present embodiment of the invention, the specific value is exemplified by "0" but is not limited thereto. In other embodiments, the specific value can be any undesired value.

It is noted that the data block B1 divided from the data D1 has 254 bytes 11~1254, and the value of each byte 11~1254 can be any one of "0"~"255". Thus, to the values of "0"~"255", at least two values of which will not appear in bytes 11~1254. Even though the value "0" does not appear in bytes 11~1254, there will be another value not appearing in the bytes 11~1254. Thus, the non-"0" value not appearing in the bytes 11~1254 can be served as the replacing value.

Also, in the present embodiment, the data block B1 has 254 bytes, so that the minimum number of data blocks can be divided from the data D1 but the invention is not limited thereto. In other embodiments, the data block B1 may have its number of bytes equal to 253 or less than 253. Moreover, the number of the bytes of the last data blocks divided from the data D1 may be less than 254 when the number of the bytes in the data D1 in not a multiple of 254, or only one data block (such as data block B1) may be divided from the data D1, however, the data encoding method of the invention is also applicable and is not affected.

Besides, in an example, the step S230 may be as follows. A table may be created, the occurrences of "0"~"255" appearing in the bytes 11~1254 of the data block B1 are counted respectively in the table, and the value not appearing in the table is obtained so as to obtain the replacing value.

Data Decoding Method

Figure 4:
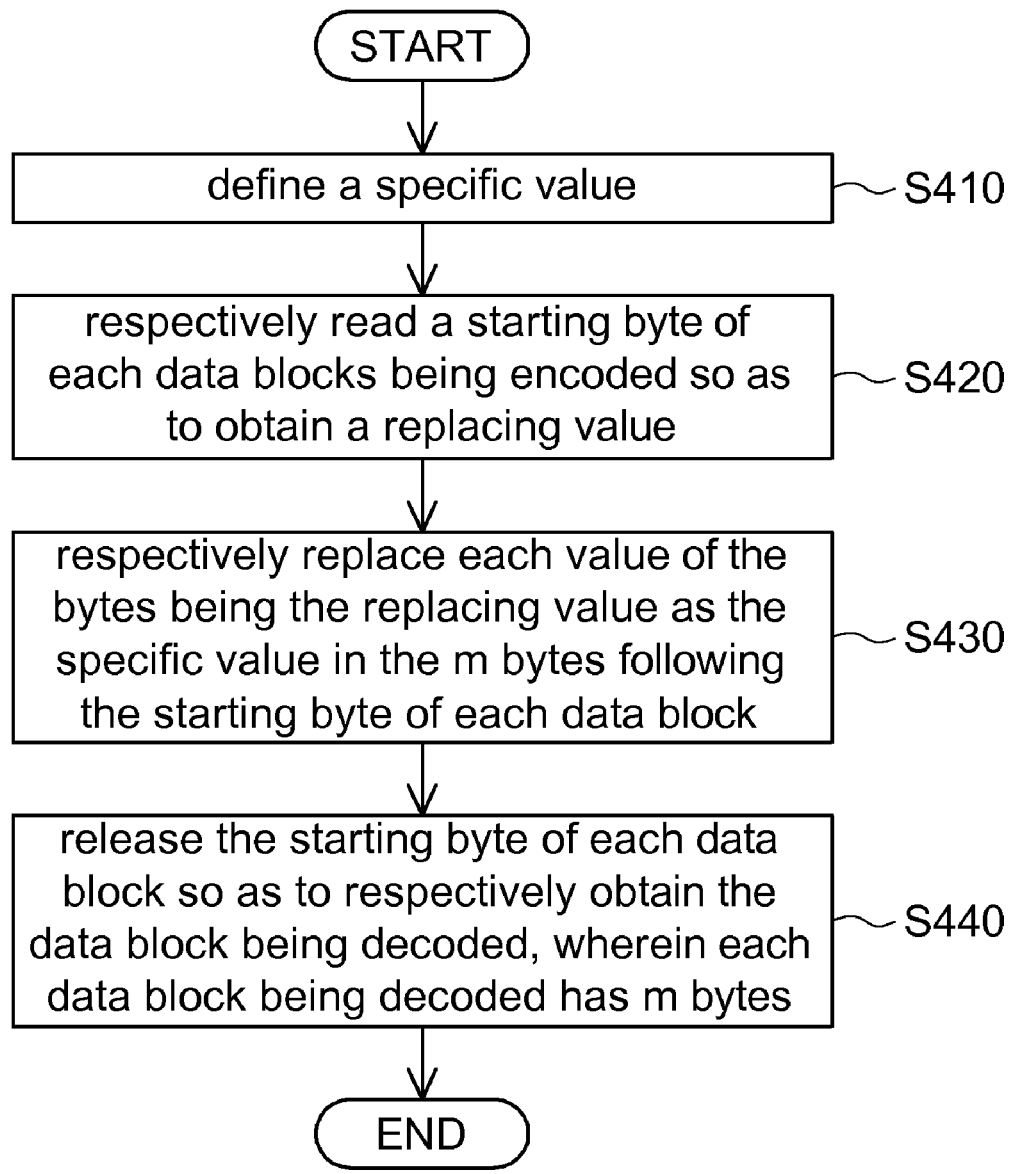
FIG. 4 shows an example of a flowchart of a data decoding method according to a preferred embodiment of the invention.

Referring to both FIG. 3 and FIG. 4. FIG. 4 shows an example of a flowchart of a data decoding method according to a preferred embodiment of the invention. First, the method begins at step S410, a specific value "0" is defined.

Next, the method proceeds to step S420, a starting byte 30 of a data block B3 is respectively read so as to obtain a replacing value "1" as shown in FIG. 3. Afterwards, the method proceeds to step S430, the values of the bytes 31, 32 and 3254 of the replacing value "1" are respectively replaced as the specific value "0" in the 254 bytes 31~3254 following the starting byte 30 of the data block B3. Then, the method proceeds to step S440, the starting byte 30 of the data block is respectively released so as to obtain the data block B1 being decoded, wherein the data block B1 being decoded has 254 bytes 21~2254.

The steps and sequences thereof in the data encoding method and the decoding method disclosed in FIG. 2 and FIG. 4 of the present embodiment of the invention can be modified or adjusted according to actual needs in application, and this invention will reach such modification or adjustment according to the appended claims.

The data encoding and decoding methods according to the embodiment may be represented by the computer executable data including executing codes stored in a computer readable medium, such as an optical disk, a magnetic tape, a hard disk drive, or a flash memory. When the computer readable medium are executed by an electronic device, the electronic device can execute the data encoding or decoding methods of the embodiment. The electronic device may, for example, but not limited to, be implemented as a handheld device, such as a personal digital assistant (PDA), a mobile phone, a portable device with an embedded system incorporated therein, or any device capable of being connected to a computer in a wired or wireless way for performing data transfer therebetween.

According to the data encoding and decoding method and computer readable medium thereof disclosed in the above embodiment of the invention, the data is divided into several data blocks, and in each data block the binary values of the bytes being specific value are replaced as the replacing value which is not appearing, and a starting byte used for storing the replacing value is allocated at the starting of each data block so as to obtain the encoded data. Thus, the encoded data will not have specific value, and the undesired value will not be stored in the encoded data. Therefore, during the process of converting the binary data into a zero-terminated string, the string will not be inappropriately split and data will not be missed.

Moreover, according to the data decoding method and computer readable medium thereof disclosed in the above embodiment of the invention, the replacing values of the starting byte stored in data blocks are respectively read, and in the data blocks the values of the bytes being the replacing value will be replaced as a specific value. Compared with the conventional method which records the position of the bytes whose value are "0", the data decoding method disclosed in the above embodiment of the invention has the advantage of fast decoding.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A data encoding method, wherein the data has a plurality of bytes each having n bits, the data encoding method comprises:
    a. defining a specific value;
    b. dividing the data into one or a plurality of data blocks each having m bytes, wherein $m \leq 2^n - 2$;
    c. respectively obtaining a replacing value not appearing in the m bytes from each data block, wherein the replacing value is not equal to the specific value;
    d. respectively replacing the values of the bytes being the specific value as the replacing value in the m bytes of each data block; and
    e. respectively allocating a starting byte at the starting of each data block and storing the replacing value in the starting byte so as to respectively obtain the data block being encoded;
    wherein each data block being encoded has m+1 bytes.

2. The data encoding method according to claim 1, wherein the data corresponds to a zero-terminated string, and the specific value is 0.

3. The data encoding method according to claim 1, wherein n=8 and m=254.

4. The data encoding method according to claim 1, wherein in the step c, a table is created, the occurrences of $0 \sim (2^n - 1)$ in the m bytes of each data block are respectively counted in the table, and the value not appearing in the table is obtained so as to obtain the replacing value.

5. The data encoding method according to claim 1, wherein in the step c, the minimum value not appearing in the m bytes of each data block is respectively obtained so as to obtain the replacing value, wherein the replacing value being obtained is not equal to the specific value.

6. A computer readable medium having computer executable data, which comprises executing codes and when executed by an electronic device, cause the device to execute a data encoding method for encoding a data which has a plurality of bytes each having n bits, wherein the data encoding method comprises:
    a. defining a specific value;
    b. dividing the data into one or a plurality of data blocks each having m bytes, wherein $m \leq 2n-2$;
    c. respectively obtaining a replacing value not appearing in the m bytes from each data block, wherein the replacing value is not equal to the specific value;
    d. respectively replacing the values of the bytes being the specific value as the replacing value in the m bytes of each data block; and
    e. respectively allocating a starting byte at the starting of each data block and storing the replacing value in the starting byte so as to respectively obtain the data block being encoded;
    wherein each data block being encoded has m+1 bytes.

7. The computer readable medium according to claim 6, wherein the data corresponds to a zero-terminated string, and the specific value is 0.

8. The computer readable medium according to claim 6, wherein n=8 and m=254.

9. The computer readable medium according to claim 6, wherein in the step c, a table is created, the occurrences of $0 \sim (2^n - 1)$ in the m bytes of each data block are respectively counted in the table, and the value not appearing in the table is obtained so as to obtain the replacing value.

10. The computer readable medium according to claim 6, wherein in the step c, the minimum value not appearing in the m bytes of each data block is respectively obtained so as to obtain the replacing value, wherein the replacing value being obtained is not equal to the specific value.

11. A data decoding method, wherein the data has a plurality of data blocks each having m+1 bytes, each the bytes has n bits, wherein $m \leq 2^n - 2$, the data decoding method comprises:
    a. defining a specific value;
    b. respectively reading a starting byte of each data blocks so as to obtain a replacing value;
    c. respectively replacing the values of the bytes being the replacing value as the specific value in the m bytes following the starting byte of each data block; and
    d. releasing the starting byte of each data block so as to respectively obtain the data block being decoded;
    wherein each data block being decoded has m bytes.

12. The data decoding method according to claim 11, wherein the data has a zero-terminated string, and the specific value is 0.

13. The data decoding method according to claim 11, wherein n=8 and m=254.

14. The data decoding method according to claim 11, wherein the specific value is the minimum value not appearing in the m bytes of the data block, and the replacing value is not equal to the specific value.

15. A computer readable medium having computer executable data, which comprises executing codes and when executed by an electronic device, cause the device to a data decoding method for decoding a data which has a plurality of bytes each having n bits, wherein the data decoding method comprises:
    a. defining a specific value;
    b. respectively reading a starting byte of each data blocks so as to obtain a replacing value;
    c. respectively replacing the values of the bytes being the replacing value as the specific value in the m bytes following the starting byte of each data block; and
    d. releasing the starting byte of each data block so as to respectively obtain the data block being decoded;
    wherein each data block being decoded has m bytes.

16. The computer readable medium according to claim 15, wherein the data has a zero-terminated string, and the specific value is 0.

17. The computer readable medium according to claim 15, wherein n=8 and m=254.

18. The computer readable medium according to claim 15, wherein the specific value is the minimum value not appearing in the m bytes of the data block, and the replacing value is not equal to the specific value.

* * * * *